United States Patent
Sjogren et al.

(10) Patent No.: US 8,407,381 B2
(45) Date of Patent: *Mar. 26, 2013

(54) KEYPAD DE-BOUNCING APPARATUS AND METHOD

(75) Inventors: Allen Erik Sjogren, Park City, UT (US); Eric Nerdrum, Kaysville, UT (US)

(73) Assignee: Fluke Corporation, Everett, WA (US)

( * ) Notice: Subject to any disclaimer, the term of this patent is extended or adjusted under 35 U.S.C. 154(b) by 180 days.

This patent is subject to a terminal disclaimer.

(21) Appl. No.: 12/881,032

(22) Filed: Sep. 13, 2010

(65) Prior Publication Data

US 2011/0004711 A1 Jan. 6, 2011

Related U.S. Application Data

(63) Continuation of application No. 11/940,160, filed on Nov. 14, 2007, now Pat. No. 7,809,867.

(51) Int. Cl.
G06F 13/12 (2006.01)
H04M 3/00 (2006.01)
(52) U.S. Cl. .......................... 710/67; 455/419
(58) Field of Classification Search .................. 710/67; 455/419
See application file for complete search history.

(56) References Cited

U.S. PATENT DOCUMENTS

| 5,068,787 A | 11/1991 | Pipella |
| 5,760,714 A * | 6/1998 | Zimmerman ................ 341/26 |
| 2005/0090940 A1* | 4/2005 | Pajakowski et al. ............. 701/1 |
| 2006/0049965 A1 | 3/2006 | Laliberte et al. ................ 341/24 |
| 2006/0068771 A1* | 3/2006 | Lou ............................... 455/419 |
| 2007/0159363 A1 | 7/2007 | Suen et al. ...................... 341/26 |

FOREIGN PATENT DOCUMENTS

| DE | 198 12 420 A1 | 9/1999 |
| EP | 0580347 A1 | 1/1994 |

OTHER PUBLICATIONS

Nathaniel W. Crutcher, Software Button Debouncing and Ergonomics, Jun. 20, 2004, Syncroness.*
Definition of 'reference voltage', 1996, Academic Press.
Office Action mailed May 30, 2012, in German Application No. 102008053944.9, filed Oct. 30, 2008, 14 pages.

* cited by examiner

Primary Examiner — Hyun Nam
(74) Attorney, Agent, or Firm — Christensen O'Connor Johnson Kindness PLLC

(57) ABSTRACT

An apparatus and method for de-bouncing keypad inputs is disclosed including interrupting a processor upon detecting a key press, reading input signals from the key pad to determine an initial port value and starting a timer. A keypad interrupt is disabled and processing resumes until expiration of the timer. The timer interrupts the processor and the input signals are read a second time and combined with the initial port value to determine a key identifier. The timer is started again and processing resumes. Upon expiration of the timer the processor checks for key release. If release is not detected, the timer is again started. If release occurs, the timer is disabled and the keypad interrupt is enabled.

20 Claims, 3 Drawing Sheets

KEYPAD DE-BOUNCING APPARATUS AND METHOD

CROSS-REFERENCE TO RELATED APPLICATION

This application is a continuation of U.S. patent application Ser. No. 11/940,160, filed Nov. 14, 2007, U.S. Pat. No. 7,809,867. This application is incorporated by reference herein in its entirety and for all purposes.

TECHNICAL FIELD

This invention relates generally to systems and methods for calibrating thermal switches.

BACKGROUND OF THE INVENTION

Push-button keypads are often used to provide input to processors. However, the mechanical switches used in keypads do not open and close instantaneously. Often the electrical coupling created when a key is pressed will be broken several times before a steady coupling occurs. Often a key will need to connect to multiple contacts in order to communicate a row and column of the key. Accordingly, the delay in achieving steady contact may result in an initial signal that indicates only one of the row or column of the key pressed.

Prior systems resolve this problem by implementing a software delay loop having a duration longer than the settling time of the keypad. In such systems, after an initial signal from the keypad is detected, the processor begins to perform a delay loop until a specified delay has passed and a steady signal can be read to determine the identity of the key pressed.

This approach is problematic for processors embedded within devices, such as drywells, or other instruments. Due to cost limitations or the processing demands of the device, the processing time available to perform de-bouncing may be limited. Given the speed of many microprocessors, the amount of processor time dedicated to debouncing could be used to perform a large number of calculations.

In view of the foregoing it would be an advancement in the art to provide a system and method for de-bouncing signals from a keypad without requiring processor delays on the order of the settling time of the keypad.

SUMMARY OF THE INVENTION

In one aspect of the invention an electronic device includes a keypad having a number of keys selectively depressible to send input signals to a processor. The keys include conductive members selectively coupling row and column signal contacts to a reference voltage. The processor is programmed to read input signals from the key pad. The processor stores a first value corresponding to input signals received after a key press is initially detected. Upon expiration of the timer, the processor is interrupted and the input signals from the key pad are again read and combined with the first value to determine a key identifier.

In another aspect of the invention, the processor is further programmed to detect release of a pressed key. The processor checks for key release and if it is not detected, starts a timer and resumes processing. Upon expiration of the timer, processing is interrupted and the processor again checks for key release. These steps may be repeated until release is detected. In another aspect of the invention, pressing a key triggers a hardware interrupt. The hardware interrupt may be disabled by the processor after detecting a key press and enabled after release is detected.

DETAILED DESCRIPTION OF PREFERRED EMBODIMENTS

Figure 1:
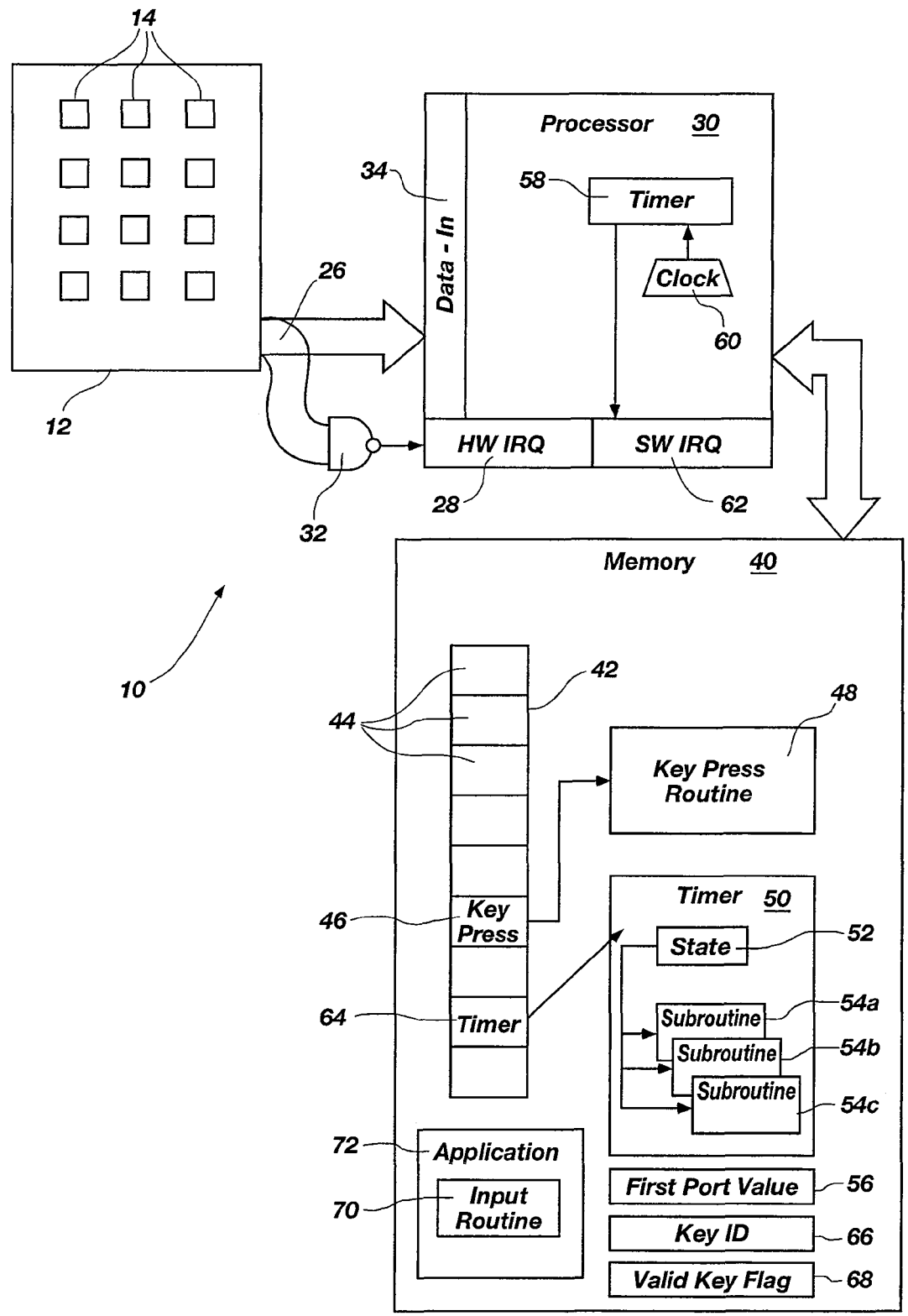
FIG. 1 is a block diagram of an electronic device including a keypad in accordance with an embodiment of the present invention.
Figure 2:
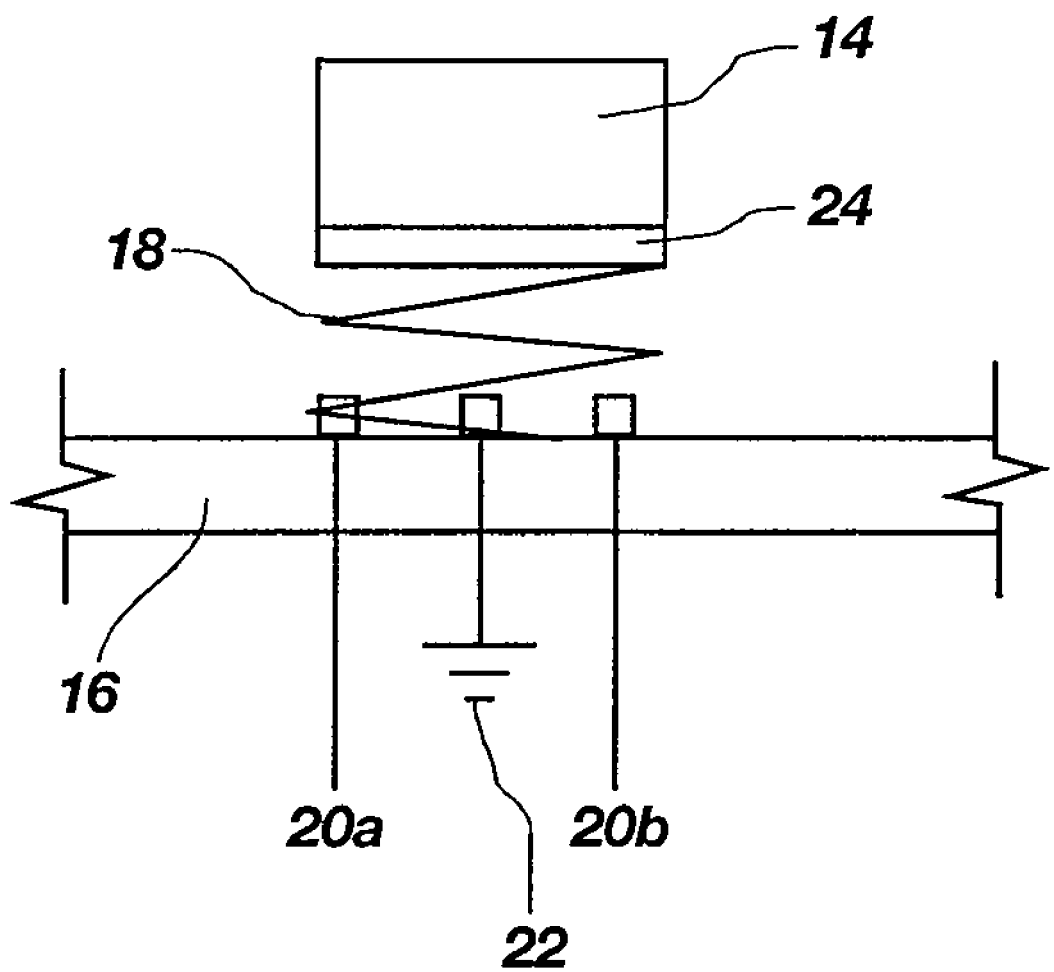
FIG. 2 is a schematic diagram of a key, in accordance with an embodiment of the invention.

Referring to FIG. 1, an electronic device 10 may include a keypad 12 having a plurality of keys 14. Referring to FIG. 2, while still referring to FIG. 1, the keys 14 may be mounted above a circuit board 16, or other substrate, having a resilient member 18, such as an elastic polymer, spring, or like structure, interposed between the keys 14 and the circuit board 16. A row contact 20a, column contact 20b, and reference contact 22 may be mounted to the circuit board 16. A conductive member 24 located between the keys 14 and the contacts 20a, 20b, 22 may be brought into contact therewith when a user depresses the keys 14. Upon depression of the keys 14, the contacts 20a, 20b are electrically coupled by the conductive member 24 to the reference contact 22. In the illustrated embodiment, the reference contact 22 is coupled to ground such that an output line coupled to the contacts 20a, 20b will experience a voltage drop when the keys 14 is pressed. As noted above, the contacts 20a, 20b may not electrically couple to the reference contact 22 simultaneously and may make and break contact a number of times before establishing steady electrical coupling.

The outputs 26 of the keypad 12 may be electrically coupled to a hardware interrupt 28 and data-in pins 34 of a processor 30. In one embodiment, the outputs 26 are coupled to the interrupt 28 by means of a NAND gate 32 such that a voltage drop on any of the outputs 26 will result in a change in the signal applied to the interrupt 28. A drop in any of the outputs 26 will therefore trigger a hardware interrupt within the processor 30. The processor 30 will then interrupt its current processing and begin executing an interrupt handling routine.

In some embodiments, a memory 40 is coupled to the processor 30. The memory 40 may include an interrupt vector 42 having a plurality of pointers 44 referencing interrupt handling routines stored within the memory 40. In some embodiments, the interrupt vector 42 is internal to the processor 30. The pointers 44 may include a pointer 46 to a key press interrupt routine 48, invoked when the hardware interrupt 28 is triggered.

In one embodiment, the key press routine 48 instructs the processor 30 to catch the signal exerted on the data-in pins 34. The key press routine 48 also disables the hardware interrupt 28 triggered by key presses such that subsequent key presses will not trigger the key press routine 48. The key press routine 48 may also enable a timer 58 and a timer interrupt and invoke a timer routine 50. The timer routine 50 may include a state 52 indicating which of a plurality of subroutines 54a-54c will be executed when the timer routine 50 is invoked.

Upon being invoked by the key press routine 48, the timer routine 50 may be in a first state corresponding to subroutine 54a. Subroutine 54a may instruct the processor 30 to read the value on the data-in pins 34 connected to the keypad 12 and to store the result as a first port value 56. The subroutine 54a may change the value of the state 52 such that upon subsequent invocation of the timer routine 50, the subroutine 54b will be executed. The routine 54a may also start the timer 58, which may be either connected to or embedded within the processor 30. The timer 58 may be coupled to a clock 60 such that the clock signals will cause the timer to count up to a specific value or down to zero. The timer 58 preferably measures a delay period sufficient for the output of the keypad 12 to settle. The timer 58 preferably does not require calculation or command execution by the processor in order to measure out the delay period. Accordingly, after the subroutine 54a sets the timer, the processor 30 may resume processing instructions unrelated to de-bouncing keypad inputs. Upon expiration of the timer 58, the timer 58 triggers a software interrupt 62. The processor 30 may then reference the interrupt vector 42 in response to the software interrupt 62. In the illustrated embodiment, the interrupt vector 42 includes a pointer 64 associating the software interrupt 62 to the timer routine 50, such that the processor 30 will execute the timer routine 50 upon receiving the interrupt from the timer 58.

As noted above, the state 52 of the timer routine 50 is set to select the subroutine 54b after being invoked by the key press routine 48. Accordingly, upon expiration of the timer 58, the interrupt will cause the processor 30 to execute the subroutine 54b. The subroutine 54b instructs the processor 30 to read the values of the outputs 26 a second time to obtain a second port value. The subroutine 54b may then combine the second port value with the first port value 56. In one embodiment, the port values are combined by ANDing. In an alternative embodiment, only the second port value is used and the first port value is ignored. The combined port values, or second port value, may then be stored as a key identifier 66.

In some embodiments, release of the keys 14 by the user is detected. The hardware interrupt 28 corresponding to a key press may remain disabled until release is detected. In such embodiments, subroutine 54b may change the state 52 to reference the third subroutine 54c and restart the timer 58. The processor 30 then resumes processing.

Upon expiration of the timer 58, the software interrupt is again triggered and the processor 30 references the interrupt vector 42, which directs the processor 30 to the timer routine 50. The timer 58 has the state 52 set to refer to the third subroutine 54c. The processor 30 therefore executes the third subroutine 54c, which instructs the processor 30 to check the data-in pins 34 to determine if the keys 14 has been released. If not, the subroutine 54c restarts the timer 58 and the processor resumes processing instructions unrelated to de-bouncing the key press. Upon expiration, the timer interrupt will again invoke subroutine 54c.

If release of the keys 14 is detected, the subroutine 54c instructs the processor 30 to disable the timer 58, enable the hardware interrupt 28 corresponding to a key press, and to set a flag 68 indicating that a key input has been received. In some embodiments, the subroutine 54c validates the key identifier 66 to determine if it corresponds to a valid key. If it does not correspond to a valid key, the subroutine 54c does not set the flag 68 to indicate that a valid input has occurred.

The subroutine 54c may also change the state 52 to refer to the first subroutine 54a. The subroutine 54c may set the value of the timer 58 to some initial value such that the next time the timer 58 is started it can simply commence counting down. The processor 30 may respond to the valid key flag 68 by invoking an input handling routine 70, which may be part of an application 72, operating system, or other program, being executed by the processor 30.

Figure 3:
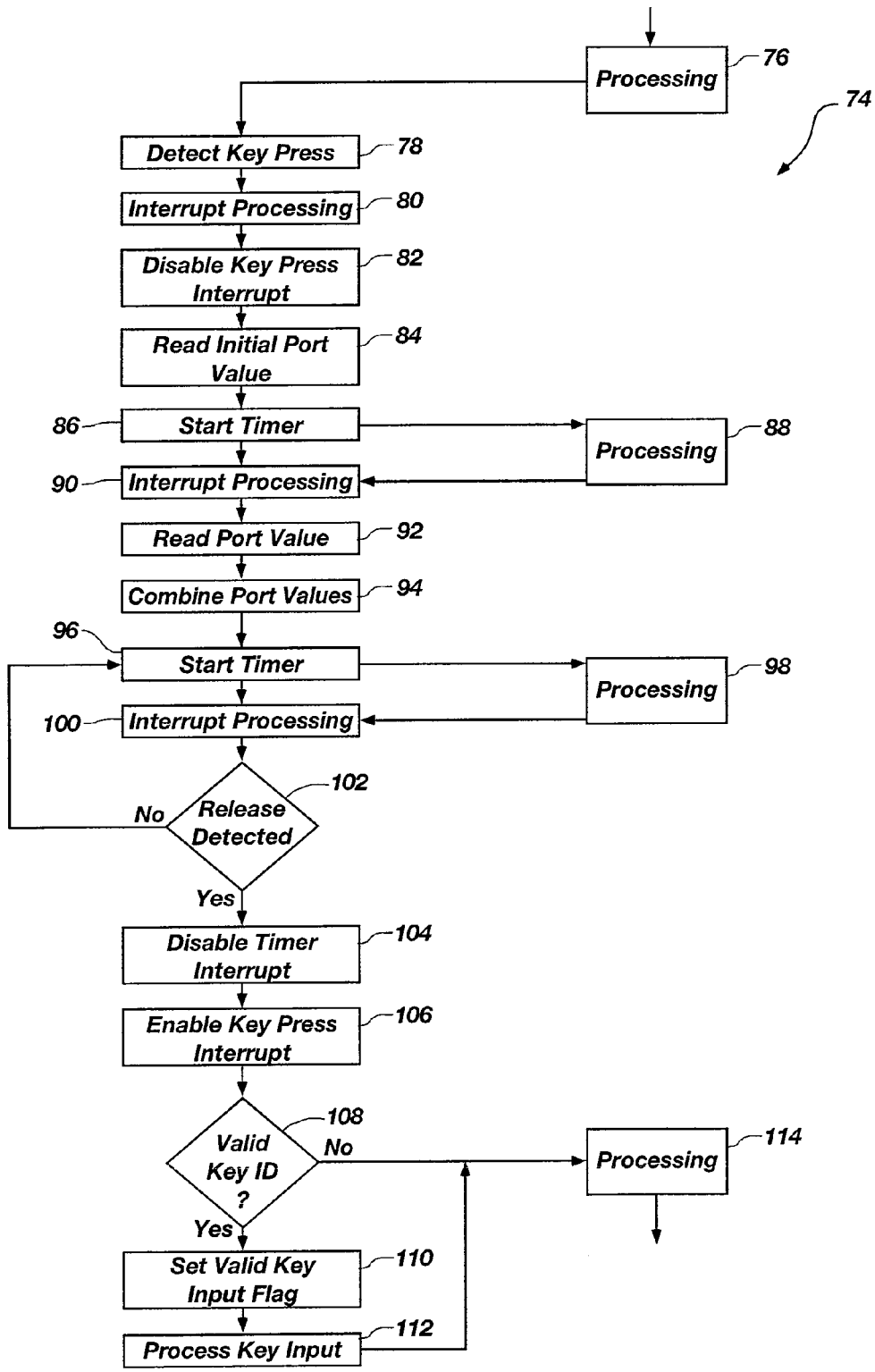
FIG. 3 is a process flow diagram of a method for de-bouncing key inputs in accordance with an embodiment of the present invention.

Referring to FIG. 3, a method 74 for debouncing a keypad input may include performing processing at block 76. Processing may include execution of instructions by the processor 30 unrelated to de-bouncing a key press, such as an application 72, operating system, or other program. At block 78, a key press is detected and at block 80 processing is interrupted. Interrupting processing may include causing the processor 30 to perform a context switch in which its current context is saved and the processor 30 begins processing relating to handling the key press. At block 82, the hardware interrupt 28 corresponding to key presses is disabled such that subsequent key presses will not interrupt processing. At block 84, the data-in pins 34 are read and the read data is stored. At block 86, a timer is started. At block 88, processing of instructions unrelated to de-bouncing the key press resumes.

Upon expiration of the timer, processing is interrupted again at block 90. The processor reads the data-in pins 34 a second time at block 92. At block 94, the data read at block 92 is combined with the data read at block 84 to determine a key identifier. Alternatively, only the value read at block 92 is used. In such embodiments, the block 84 may be omitted or the read data ignored. At block 96, the timer is started again and processing instructions unrelated to de-bouncing the key press resumes at block 98.

Processing is interrupted at block 100 upon expiration of the timer 58 and at block 102 the method 74 includes evaluating whether the pressed key 14 has been released. If not, then the steps of blocks 96-102 are repeated. If at block 102, release of the pressed keys 14 is detected, then the timer is disabled at block 104, and the hardware interrupt 28 corresponding to key presses is enabled at block 106. At block 108, the key identifier may be evaluated to determine whether it corresponds to a valid key input. If it does, then a valid key input flag is set at block 110 and the input may be processed at block 112, such as by the application 72, an operating system, or other program. At block 114, processing of instructions unrelated to de-bouncing a key press resumes.

Although the present invention has been described with reference to the disclosed embodiments, persons skilled in the art will recognize that changes may be made in form and detail without departing from the spirit and scope of the invention. Such modifications are well within the skill of those ordinarily skilled in the art. Accordingly, the invention is not limited except as by the appended claims.

What is claimed is:

1. An electronic device comprising:
 a plurality of keys configured to produce output signals responsive to a key press; and
 a processor coupled to receive the output signals produced by the plurality of keys, wherein the processor is configured to receive a first interrupt signal in response to receiving the output signals, wherein the processor is further configured to store a value indicative of the key press and to initiate a first delay in response to receiving the first interrupt signal, wherein the processor is further configured to process information unrelated to the key press after the first delay is initiated, wherein the processor is further configured to receive a second interrupt signal upon a completion of the first delay, thereby interrupting the processor from further processing information unrelated to the key press, and wherein the processor is further configured to store a second value indicative of the key press in response to receiving the second interrupt signal.

2. The device of claim 1 wherein the processor comprises a timer configured to measure a second delay and to generate a software interrupt signal responsive to receiving the second interrupt signal.

3. The device of claim 2 wherein the processor is further configured to detect a key release responsive to receipt of the software interrupt signal.

4. The device of claim 1 wherein the processor is further configured to generate a combined port value signal corresponding to at least one of the first value and the second value.

5. The device of claim 1 wherein the processor is further configured to process instructions while the first delay is measured.

6. The device of claim 1 wherein at least one of the first value and the second value are stored in a memory.

7. An electronic device comprising:
   a plurality of keys configured to provide output signals responsive to a key press, wherein the output signals are provided at a plurality of signal contacts;
   a memory configured to store data; and
   a processor coupled to the memory and coupled to the plurality of signal contacts, wherein the processor is configured to store a first port value indicative of the key press in the memory, wherein the processor is further configured to store a second port value indicative of the key press in the memory a predetermined period after the processor stores the first port value, and wherein the processor is further configured to process information unrelated to the key press during the predetermined period.

8. The device of claim 7 wherein the processor is further configured to store the second port value responsive to receipt of a first interrupt signal.

9. The device of claim 8 wherein the plurality of keys comprises a plurality of signal contacts and reference contacts and each key of the plurality of keys is configured to couple at least two signal contacts to a reference contact, and wherein the processor is further configured to detect the at least two signal contacts decoupling from the reference contact responsive to a second interrupt signal.

10. The device of claim 7 wherein the plurality of keys comprises a plurality of signal contacts and reference contacts and each key of the plurality of keys is configured to couple at least two signal contacts to a reference contact, and wherein the at least two signal contacts correspond to a row of the first key and a column of the first key.

11. The device of claim 7 wherein the processor is further configured to initiate a timer after storing at least one of the first port value and second port value.

12. The device of claim 7 wherein the memory stores a plurality of subroutines, each subroutine configured to initiate responsive to generation of a corresponding interrupt signal.

13. The device of claim 7 wherein the processor is further configured to generate a key identifier corresponding to the first port value and second port value.

14. A method for detecting a key press comprising:
   interrupting processing by a processor responsive to the key press;
   storing a first value indicative of the key pressed;
   resuming processing by the processor, wherein the resumed processing is unrelated to the key press;
   measuring a first preconfigured time period; and
   after measuring the first preconfigured time period, storing a second value indicative of the key pressed.

15. The method of claim 14, further comprising:
   combining the first value and second value to produce a key identifier.

16. The method of claim 15, further comprising:
   measuring a second preconfigured time period; and
   detecting release of the key pressed.

17. The method of claim 15, further comprising:
   processing the key identifier as a user input.

18. The method of claim 14 wherein interrupting processing by the processor responsive to the key press comprises interrupting processing by the processor responsive to coupling electrical nodes together responsive to the key press.

19. The method of claim 14 wherein storing the first value and the second value comprises storing the first value and second value in a memory.

20. The method of claim 14 wherein measuring the first preconfigured time period comprises:
   initiating a timer; and
   generating an interrupt signal.

* * * * *